US011169218B2

(12) United States Patent
Wan et al.

(10) Patent No.: US 11,169,218 B2
(45) Date of Patent: Nov. 9, 2021

(54) CURRENT MONITOR WITH FAULT DETECTION

(71) Applicant: Analog Devices, Inc., Norwood, MA (US)

(72) Inventors: Quan Wan, Belmont, MA (US); Brian A. Pelletier, Georgetown, MA (US)

(73) Assignee: Analog Devices, Inc., Wilmington, MA (US)

( * ) Notice: Subject to any disclaimer, the term of this patent is extended or adjusted under 35 U.S.C. 154(b) by 238 days.

(21) Appl. No.: 16/230,890

(22) Filed: Dec. 21, 2018

(65) Prior Publication Data

US 2020/0200812 A1    Jun. 25, 2020

(51) Int. Cl.
| | | |
|---|---|---|
| *G01R 19/165* | (2006.01) | |
| *G01R 31/50* | (2020.01) | |
| *H02H 3/08* | (2006.01) | |
| *H03F 3/45* | (2006.01) | |
| *H02H 3/04* | (2006.01) | |

(Continued)

(52) U.S. Cl.
CPC ......... *G01R 31/50* (2020.01); *G01R 19/0038* (2013.01); *H02H 3/044* (2013.01); *H02H 3/08* (2013.01); *H03F 3/45977* (2013.01); *H03M 1/12* (2013.01)

(58) Field of Classification Search
CPC .... G01R 31/50; G01R 19/0038; H02H 3/044; H02H 3/08; H03F 3/45977; H03M 1/12
USPC ....... 324/500, 509, 512, 522, 535, 537, 555, 324/600, 602, 605, 606, 609, 629, 647, 324/649, 691, 705, 713, 76.11, 98; 702/1, 57, 64
See application file for complete search history.

(56) References Cited

U.S. PATENT DOCUMENTS

| | | |
|---|---|---|
| 4,899,068 A | 2/1990 | Klose et al. |
| 5,565,800 A | 10/1996 | Kobayashi |

(Continued)

FOREIGN PATENT DOCUMENTS

| | | | |
|---|---|---|---|
| JP | 4642413 B2 * | 3/2011 | ............ G01R 19/00 |
| TW | 544995 B | 8/2003 | |

OTHER PUBLICATIONS

Espacenet translate JP4642413B2 (Year: 2011).*

(Continued)

*Primary Examiner* — Melissa J Koval
*Assistant Examiner* — Courtney G McDonnough
(74) *Attorney, Agent, or Firm* — Schwegman Lundberg & Woessner, P.A.

(57) ABSTRACT

A difference amplifier can be used for providing an amplified representation of a sensed current through a load device. A separate signal path can be used to provide fast fault detection, without requiring use of the difference amplifier. For example, a voltage scaling circuit can be used to scale a differential input signal indicative of the load current. The scaled representation can then be compared against a specified threshold corresponding to a fault current value. In this manner, a high-speed low-voltage comparator can be used to provide detection of a fault current that otherwise exceeds an input range of the difference amplifier, where the difference amplifier is used separately for precision current monitoring. As an illustrative example, such a scheme can provide fault detection even when an input of the difference amplifier is saturated.

20 Claims, 6 Drawing Sheets

(51) Int. Cl.
  *G01R 19/00* (2006.01)
  *H03M 1/12* (2006.01)

(56) References Cited

U.S. PATENT DOCUMENTS

| | | | |
|---|---|---|---|
| 6,396,430 B1* | 5/2002 | Li | H03F 3/45977 327/77 |
| 7,102,335 B1* | 9/2006 | Solie | G11C 5/141 323/273 |
| 7,454,967 B2 | 11/2008 | Skurik | |
| 7,511,645 B1 | 3/2009 | Ranucci | |
| 8,570,072 B2 | 10/2013 | Gozali et al. | |
| 8,937,497 B1* | 1/2015 | Tobin | G06F 1/26 327/56 |
| 9,945,886 B2 | 4/2018 | Yugou et al. | |
| 2003/0001531 A1* | 1/2003 | Xi | H02P 6/28 318/400.22 |
| 2011/0101918 A1* | 5/2011 | Tsukamoto | H02J 7/0021 320/118 |
| 2013/0214806 A1* | 8/2013 | Saloio, Jr. | H02H 3/05 324/750.01 |
| 2015/0070086 A1* | 3/2015 | Tan | G11C 5/147 327/540 |

OTHER PUBLICATIONS

Sepke, Todd, et al., "Noise Analysis for Comparator-Based Circuits", IEEE Transactions on Circuits and Systems—I: Regular Papers, vol. 56, No. 3, (Mar. 2009), 13 pgs.

Shih, Tanchu, et al., "A Fully Differential Comparator using a Switched-Capacitor Differencing Circuit with Common-Mode Rejection", IEEE Journal of Solid-State Circuits, vol. 32, Issue 2, (Feb. 1997), 4 pgs.

\* cited by examiner

CURRENT MONITOR WITH FAULT DETECTION

FIELD OF THE DISCLOSURE

This document pertains generally, but not by way of limitation, to current monitoring circuits and related techniques, and more particularly to current monitoring including fault detection.

BACKGROUND

In various applications, an electrical current can be sensed such as for purposes of monitoring, protection, or control of a load device. Such current sensing can be performed in relation to single-phase or multi-phase loads. Generally, a current sensing element such as a sensing resistor can be placed in-line with power supply and a load. In a multi-phase system, current sensing elements can be placed in-line with the power supply and loads corresponding to each phase. A current flowing through the power supply and a corresponding load, such as an instantaneous current, can be determined such as by amplifying and measuring a differential signal representative of a voltage drop produced by the sensing device. An output of such amplification can be used for purposes of monitoring or control of a load device.

SUMMARY OF THE DISCLOSURE

As mentioned above, a signal indicative of a current flowing through a load can be amplified. In an example, an analog amplifier such as a difference amplifier can be used to amplify a differential signal indicative of such a load current. In one approach, an output of such a difference amplifier can also be routed to other devices downstream of the difference amplifier, such as for use in protection of the load (e.g., fault detection). The present inventors have recognized that such an approach can present challenges. For example, the difference amplifier can be configured to provide a relatively wide common-mode input voltage tolerance, such as tolerating between about −20V to about 80V, as an illustrative example. The difference amplifier can also have a differential input voltage range specified to encompass a range of voltages corresponding to a desired load current measurement range. Generally, the difference amplifier isolates the downstream devices from the relatively-higher common-mode voltage while amplifying a relatively-lower differential-mode voltage indicative of the load current.

If the difference amplifier is also used to provide signal conditioning for downstream fault-detection devices such as a fault-current-detecting comparator, the differential input voltage range of the difference amplifier must also encompass a voltage magnitude corresponding to a fault current threshold. This fault current threshold may be many times the value of the load current magnitude expected during normal operation. Accordingly, if the difference amplifier has a wider differential input voltage range to drive downstream fault detection devices, one or more of accuracy or precision may be sacrificed when the differential signal magnitude is not near the fault threshold.

To address such challenges, the present inventors have recognized a separate signal path can be used to provide fast fault detection, instead of relying on the same difference amplifier as used for precision load current monitoring. For example, a voltage scaling circuit can be used, such as a passive circuit including respective resistor divider networks, to scale a differential input signal indicative of the load current. The scaled representation can then be compared against a specified threshold corresponding to a fault current value. In this manner, a high-speed low-voltage comparator can be used to provide detection of a fault current that otherwise exceeds an input range of the difference amplifier used separately for precision current monitoring. As an illustrative example, such a scheme can provide fault detection even when an input of the difference amplifier is saturated.

A threshold used for fault current detection can be provided using a threshold signal input. A comparator circuit can aggregate the threshold signal with positive and negative polarity components of a differential signal indicative of the load current. In this manner, an adjustable fault current threshold can be established.

In an example, a current monitoring circuit can provide enhanced dynamic range and rapid fault detection in the presence of common-mode voltage. The current monitoring circuit can include a difference amplifier circuit comprising a two-terminal input to receive a differential signal indicative of a current being monitored and an output to provide a signal having a magnitude indicative of the current being monitored, a voltage scaling circuit, and a comparator circuit comprising a two-terminal input to receive a scaled representation of the differential signal of the current being monitored, from the voltage scaling circuit, for comparison against a threshold signal indicative of a fault current threshold. The comparator circuit can be arranged to operate having a continuous-time input scheme, or a discrete-time (e.g., discrete-time switched capacitor) input scheme. In an example, a method for current monitoring can include receiving a differential signal indicative of a current being monitored, and in response, providing an output comprising a signal having a magnitude indicative of the current being monitored. The method can include scaling the differential signal indicative of the current being monitored to provide a scaled representation, and comparing the scaled representation against a threshold signal indicative of a fault current threshold, using a comparator circuit.

Generally, the examples described in this document can be implemented in whole or in part within an integrated circuit package, such as monolithically integrated using a commonly-shared integrated circuit die. This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
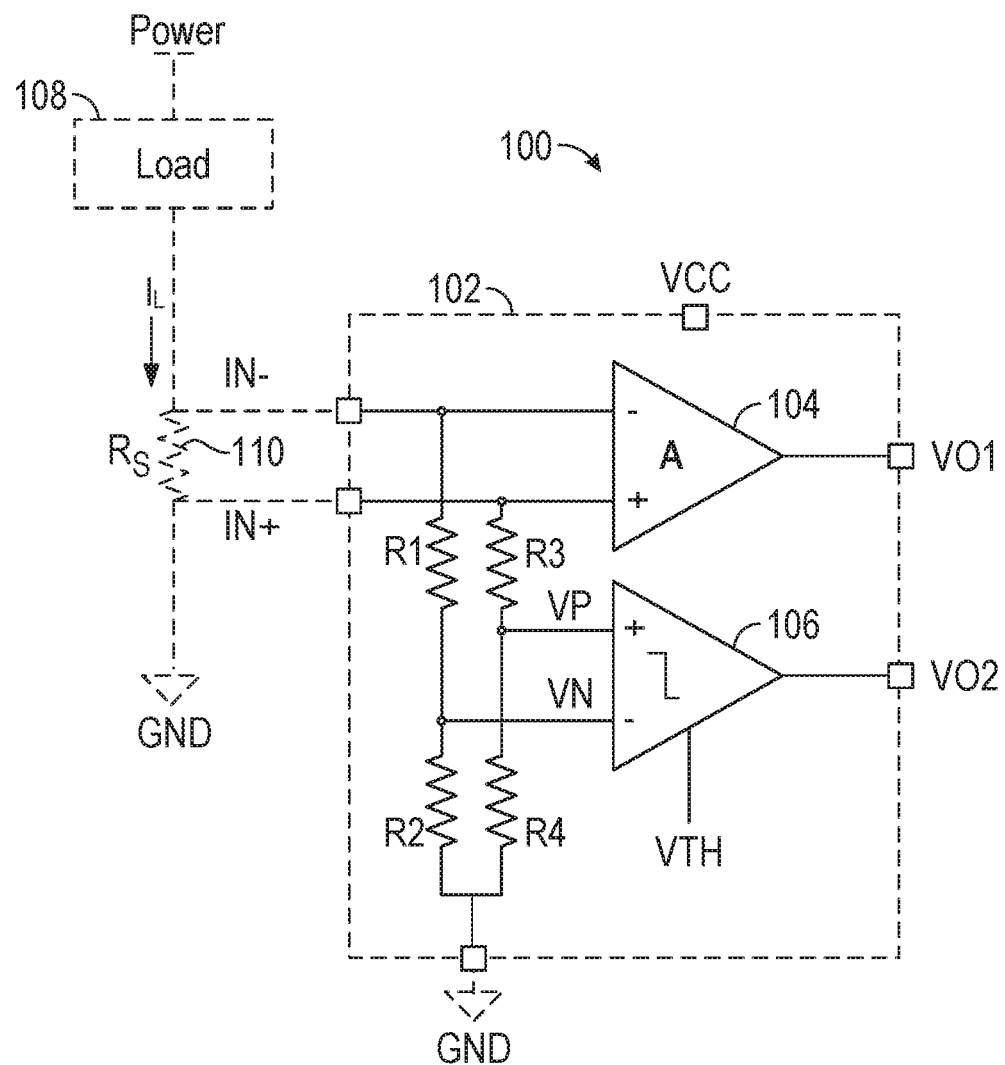
FIG. 1 illustrates generally an example of an electrical apparatus for generating a signal indicative of a monitored current.

A difference amplifier circuit can be used to amplify a signal provided by a current sensing element to provide "precision" current monitoring. The current sensing element can include a resistor located in series with a load device. The current monitoring can be used for various applications such as motor control, solenoid control, or power management. In certain applications, a fault current (e.g., a current having a magnitude exceeding a specified threshold) may need to be detected quickly to provide protection (e.g., to protect equipment from damage or to inhibit danger to personnel or facilities). As mentioned generally above, in one approach, a difference amplifier can provide an output that can then be fed into a comparator. In this manner, the difference amplifier provides both an amplified output indicative of the current being monitored, and signal conditioning of an input signal for a comparator to detect a fault condition (e.g., the difference amplifier can remove a high voltage common-mode input and can convert a received differential input signal to an amplified single-ended signal as an output). The downstream comparator can compare an output of the difference amplifier against a threshold. In the event of a fault condition, such as a short circuit or inductor saturation condition, the comparator is expected to detect such a condition quickly.

The approach mentioned above, using a comparator downstream of a difference amplifier, can present challenges. One challenge is dynamic range reduction. As an illustrative example, assuming voltage gain provided by a difference amplifier is 20, and a "normal" operating load current limited to 50 amperes (A) in magnitude, an output swing of the difference amplifier is 0V to 5V in proportion to a load current ranging from 0 A to 50 A. In this illustrative example, to maximize a system dynamic range, the shunt resistor can be chosen as 5V divided by 20, then divided by 50 A, corresponding to a value of 5 milliohms (mΩ). If a downstream comparator is used for fault detection, generally, the comparator should not be triggered until a load current is large enough to cause possible damage to the system, for example. Accordingly, a fault current threshold is generally specified to be a multiple of the normal operating current magnitude, such four times as large as the maximum "normal" operating current.

In this illustrative example, if the shunt resistor is chosen as 5 mΩ, the amplifier would be saturated once the load current is greater than 50 A, precluding detection of any load current greater in magnitude than 50 A. A value of the shunt resistor can be reduced, such as to a value of around 1 mΩ, to provide a greater detection range. However, by reducing the shunt resistor value by a factor of five, a dynamic range of the system is also reduced by a factor of about five.

Another challenge presented by the "serial" approach of using the difference amplifier to feed a fault current comparator is a lack of redundancy. If the difference amplifier fails or is saturated, a downstream fault current comparator may be precluded from detecting a fault current. Characteristics of the difference amplifier such as finite slew rate, bandwidth, phase margin, or settling time may induce latency or delay in a downstream fault current comparator response to a fault condition. During transients, an overshoot may appear at the difference amplifier output, so further signal condition such as deglitching, may add to latency or delay in fault detection.

The present inventors have recognized that respective (e.g., separate) signal paths can be used for fault current detection and precision current monitoring. For example, one signal path can provide wide dynamic range but not necessarily fast response to dynamic signals to support precision monitoring of current, and another (e.g., fault current detection) path can be configured to be fast, robust to fault signal magnitudes, and reliable. The fault current detection path can have a lower precision as compared to the analog signal path used for precision current monitoring. FIG. 1 illustrates generally an example of an electrical apparatus 100 for generating a signal indicative of a monitored current, where a comparator circuit 106 is fed from a current sensing element such as a resistor 110, separately from signal path through a difference amplifier 104.

In the example of FIG. 1, a load 108 can be supplied with a current, $I_L$, and such a current can be sensed using a current sensing element such as using a sense resistor 110 (Rs). If a sense resistor 110 is used as a current sensing element, a differential signal developed across the shunt resistor is usually small, such as ranging from microvolts (μV) to hundreds of millivolts (mV), as an illustrative example. The difference amplifier 104 rejects a common-mode input voltage and amplifies a differential input voltage, where the differential input voltage is generally proportional to the load current being monitored. An output of the difference amplifier can then be converted into digital signal, such as using an analog-to-digital converter. For industrial or automotive applications, a common-mode voltage present at the input to the difference amplifier can span tens of volts, or more, such as having a range from about −20V to about 80V, according to an illustrative example.

A differential signal developed across the resistor 110 can include a positive component, IN+, and a negative component, IN−, such as can be provided to the difference amplifier 104, to be amplified by a gain factor, "A," An output of the difference amplifier 104, VO1, can be provided to other signal conditioning or processing circuitry such as further amplification, filtering, or digitization blocks. In this manner, the signal VO1 indicative of the load current, $I_L$, can be used for other operations such as monitoring or control (e.g., to control or modulate a pulse-width supplied to a motor, as an illustrative example).

By contrast with other approaches, the technique shown in FIG. 1 can include use of a comparator circuit 106 that receives a differential input rather than a single-ended input. The differential input, having components VP and VN, may be supplied directly from the sense resistor 110, or can be scaled using a voltage scaling circuit, such as comprising respective divider circuits. As shown in FIG. 1, a first resistor divider circuit comprising resistors R1 and R2 can scale a voltage at node IN− to provide a scaled input to node VN. Similarly, a second resistor divider circuit comprising resistors R3 and R4 can scale a voltage at node IN+ to provide a scaled input to node VP. In this manner, a common-mode voltage present at nodes IN− and IN+ can be attenuated (e.g., reduced), such as permitting use of a low-voltage high-speed comparator topology for the comparator circuit 106. A combination of resistance provided by the resistor divider circuits and either dedicated capacitors or parasitic capacitance can also provide a low-pass filter to reject damaging high-voltage transients or electromagnetic interference, as illustrative examples. Because the voltage scaling circuit is used for the comparator circuit 106 input but not the difference amplifier 104, the voltage scaling circuit does not significantly impact the dynamic range or noise performance of the difference amplifier 104 signal chain. The comparator circuit 106 can include a higher bandwidth or shorter time-domain latency than correspondence characteristics of the difference amplifier 104. For example, a latency of the comparator circuit 106 (e.g., a duration between an instant corresponding to receiving a signal indicative of a fault current in excess of the fault current threshold and an instant where the output of the comparator meets or exceeds a specified logic level) can be less than a corresponding group delay of the difference amplifier 104.

The electrical apparatus 100 of FIG. 1 can be co-integrated within a commonly-shared integrated circuit package, such as including the difference amplifier 104, the comparator circuit 106, the voltage scaling circuit (e.g., resistor divider circuits). An integrated circuit package 102 can include "pins," or terminals, such as to receive a positive supply voltage, (e.g., VCC), and a reference node (e.g., GND) or a negative supply voltage, along with a differential input comprising the components and IN− and IN+. The integrated circuit package 102 can provide outputs such as VO1 corresponding to an output signal indicative (e.g., proportional) to the current $I_L$ being monitored, and VO2 corresponding to an output of the comparator circuit indicative of a fault condition when IL exceeds a specified fault current threshold. The comparator circuit 106 can include an input to receive a threshold signal, VTH, indicative of a fault current threshold, such as to provide an adjustable fault current threshold. VTH can be exposed as another terminal provided by the integrated circuit package 102, or VTH can be established internally. For example, VTH can be established using a digital-to-analog converter such as providing adjustability using a digital control signal.

Various comparator circuit 106 topologies can be used, such as to accept a differential input signal and a threshold signal, and to aggregate such signals to be provided to an inverting input and a non-inverting input of a two-terminal comparator block.

Figure 2A:
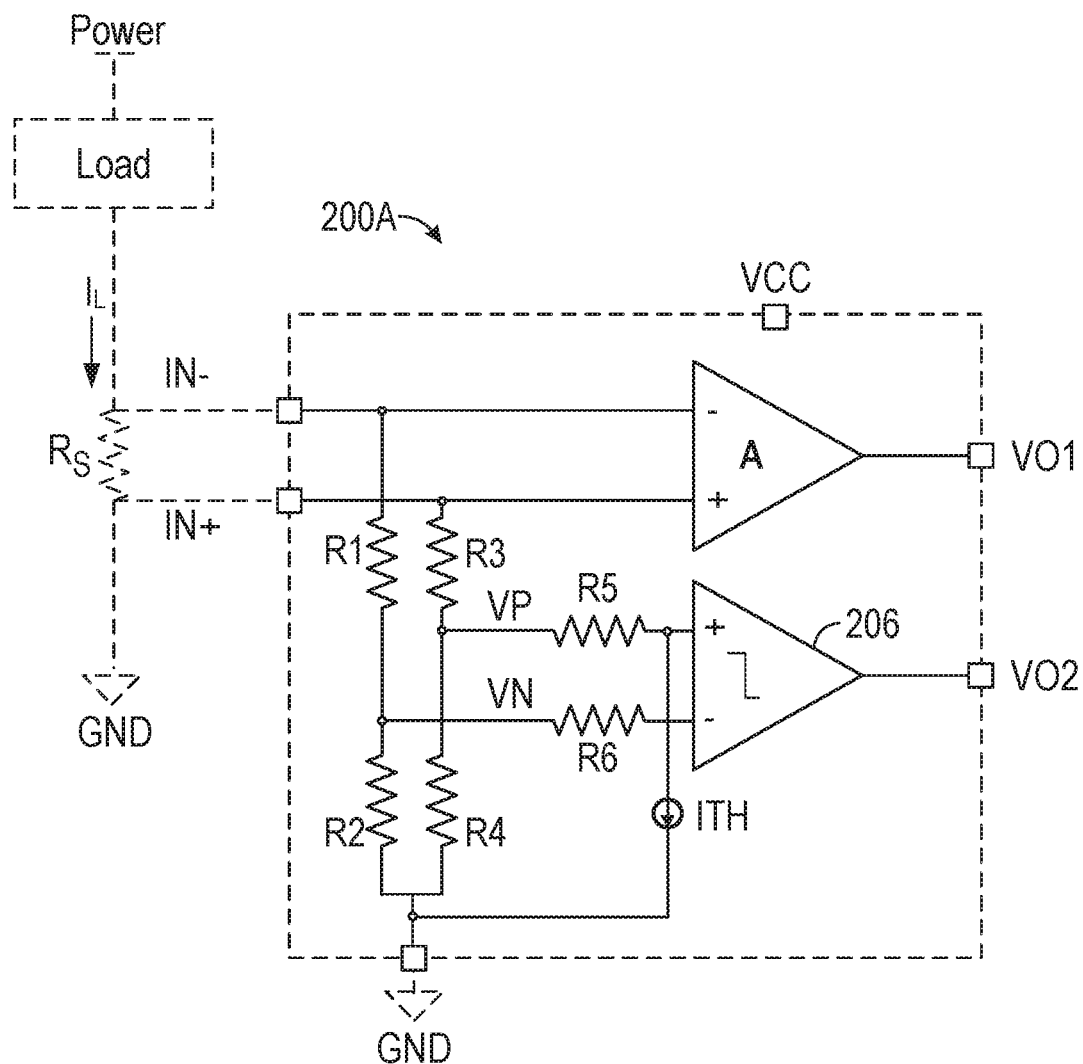
FIG. 2A and FIG. 2B illustrate generally respective examples of an electrical apparatus for generating a signal indicative of a monitored current, including continuous-time comparator circuits.
Figure 2B:
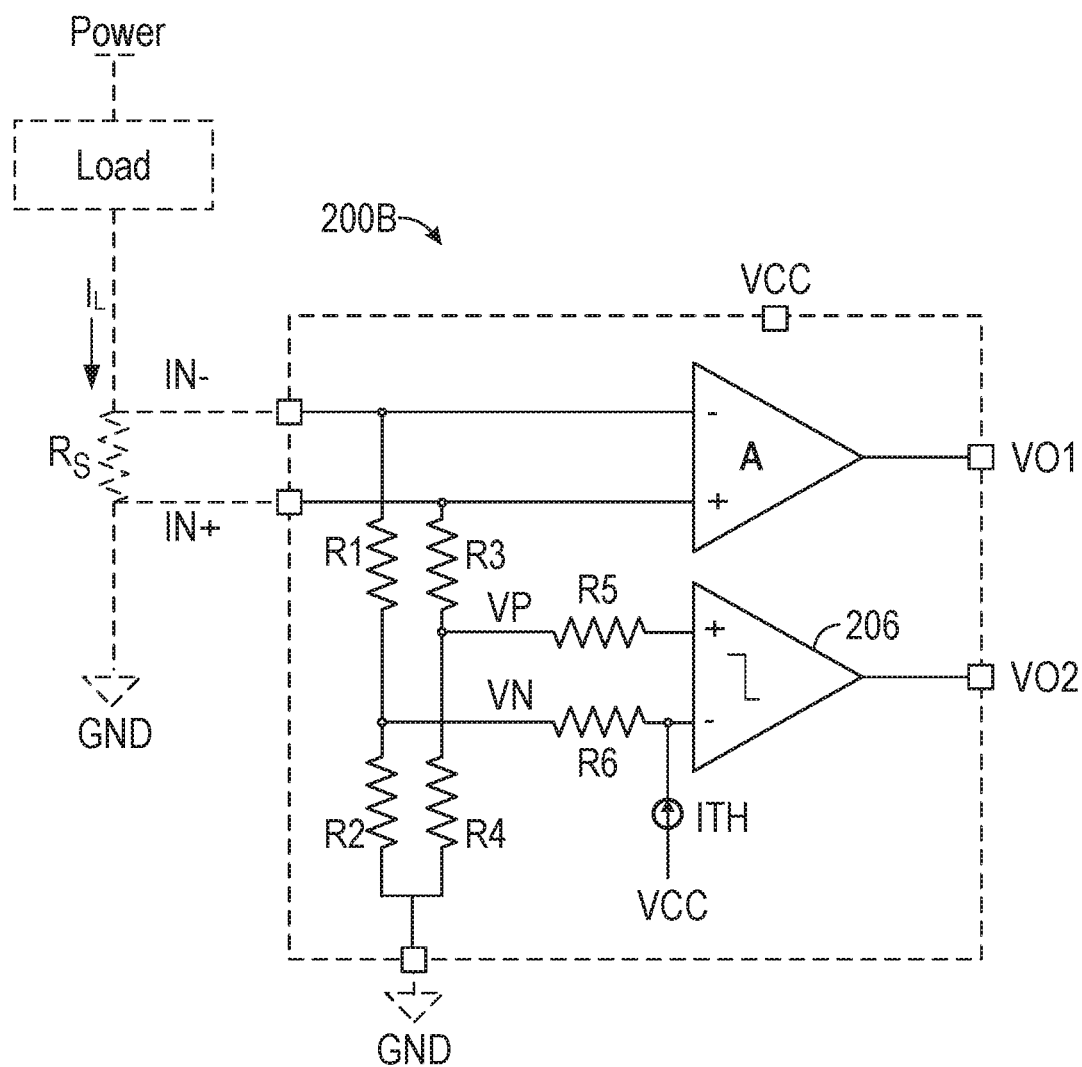

FIG. 2A and FIG. 2B illustrate generally respective examples of an electrical apparatus for generating a signal indicative of a monitored current, including continuous-time (e.g., analog) comparator circuits. In the example of FIG. 2A, an electrical apparatus 200A can include a circuit topology similar to the example of FIG. 1. In FIG. 2A, the electrical apparatus 200A can include an analog comparator block 206 having input nodes VP and VN coupled to the comparator block 206 inputs through respective series resistors R5 and R6. A threshold can be established using a current source, ITH. A threshold voltage can be set by adjusting one or more of ITH or various resistor values. For example, with ITH connected between the positive input terminal of the comparator block 206 and a reference node (GND) as shown in FIG. 2A, a threshold voltage VTH=ITH*(R5+R3//R4) (where R3//R4 represents a value of the parallel combination of R3 and R4, (R3*R4/(R3+R4)). Similarly, in FIG. 2B, the electrical apparatus 200B can include a comparator block 206 and series resistors R5 and R6, with a current source, connected between the negative (e.g., inverting) input terminal and a reference node (VCC). In the example of FIG. 2B, a threshold voltage VTH=ITH*(R6+R1//R2) (where R1//R2 represents a value of the parallel combination of R1 and R2). Other examples are possible, such as by applying ITH current values to the non-inverting and inverting inputs of the comparator block 206 (e.g., combining the aspects of FIG. 2A and FIG. 2B). In such as combination, a threshold voltage VTH=ITH (R5+R6+R1//R2+R3//R4).

Figure 3:
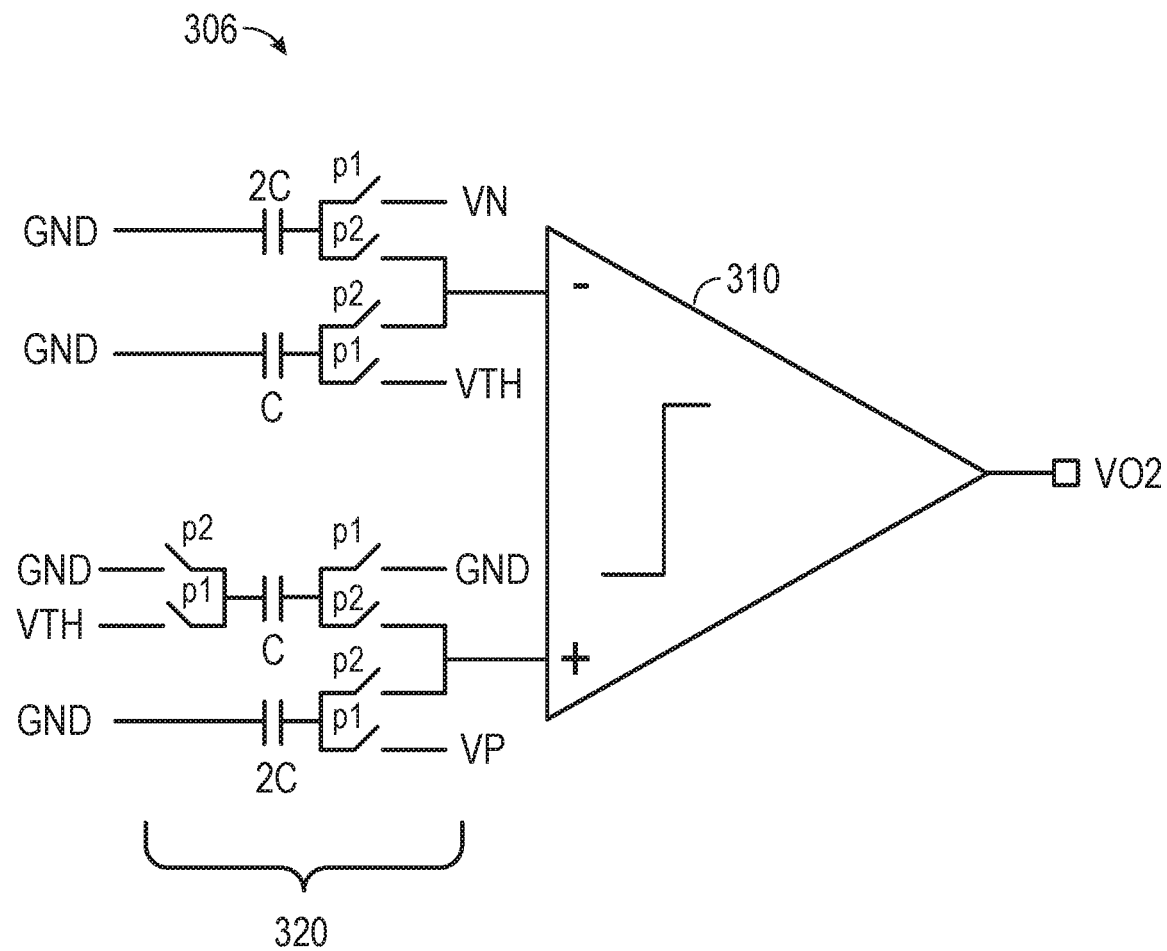
FIG. 3 illustrates generally an example of a switched-capacitor comparator circuit, such as can receive a threshold signal indicative of a fault current threshold, for comparison with a differential signal indicative of a monitored load current.

FIG. 3 illustrates generally an example of a comparator circuit 306 having a switched-capacitor input topology, such as can receive a threshold signal, VTH, indicative of a fault current threshold, for comparison with a differential signal (comprising components VP and VN) indicative of a monitored load current. In FIG. 3, the comparator circuit can include a two-terminal comparator block 310, such as having an inverting input ("−") and a non-inverting input ("="). A switched-capacitor input circuit 320 can be used, such as controlled using a control circuit configured to selectively close various switches during a first phase (corresponding to switches labeled "p1") or a second phase (corresponding to switches labeled "p2"). Clock signals corresponding to phase "p1" and "p2" can be non-overlapping (e.g., when "p1" is asserted, closing switches labeled "p1," "p2" is de-asserted, and vice versa, such that there is no duration over which "p1" and "p2" are both asserted).

During phase 1, switches labeled "p1" are closed, resulting in voltage sampling of the input signals VN, VTH, and VP onto respective capacitors (e.g., VN sampled by a capacitor having value "2C"; VTH sampled by a capacitor having value "C", and VP sampled by a capacitor having a value "2C"). During phase 2, the input signals VN and VP are compared against the threshold voltage, where portions of the single-ended threshold voltage are distributed in a differential manner across the inputs of the comparator block 310. A hysteresis behavior can also be implemented, such as by adding additional capacitors to introduce a "dead-band" offset value. Other comparator circuit topologies can be used. For example, the topology of FIG. 3 can be modified to include a pre-amplifier and feedback paths, such as to support offset compensation or "auto-zero" behavior. An output of the pre-amplifier can include a differential signal provided to an input of a two-terminal comparator.

Figure 4:
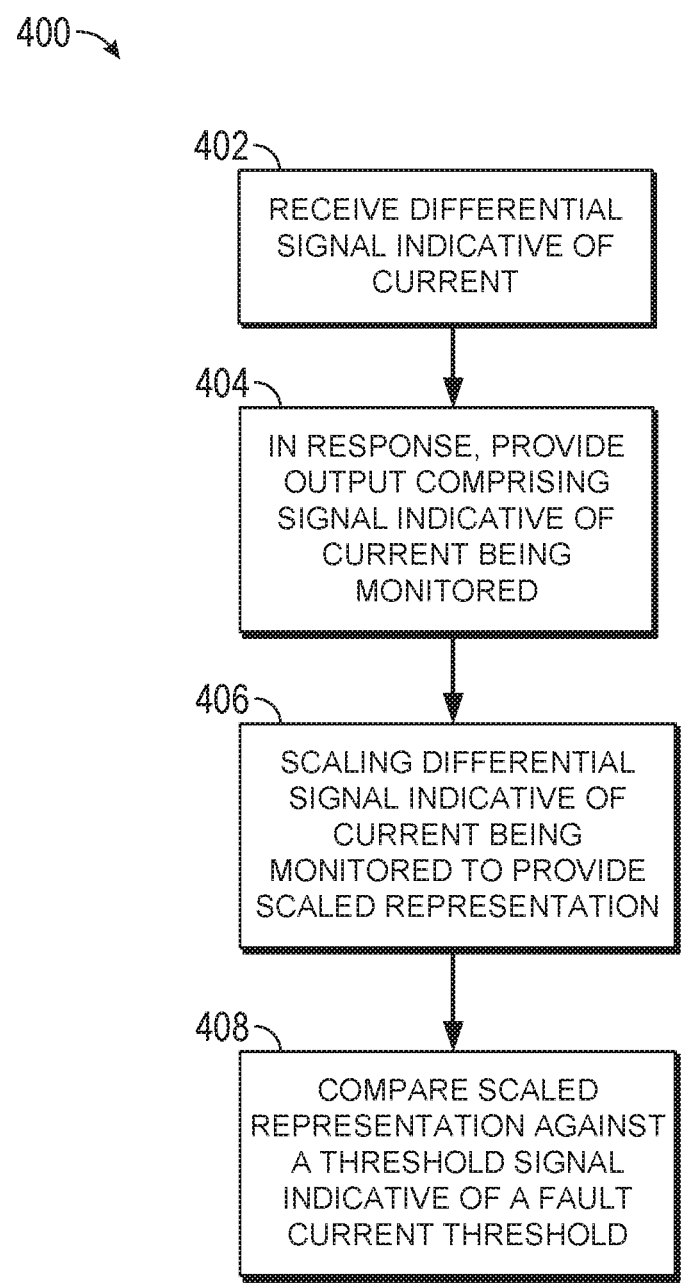
FIG. 4 illustrates generally a technique, such as a method, that can include receiving a differential signal indicative of a monitored current and providing an output comprising a signal indicative of the current being monitored, along with scaling a differential signal representative of the current being monitored and comparing the scaled representation with a threshold signal indicative of a fault current threshold.

FIG. 4 illustrates generally a technique 400, such as a method, that can include receiving a differential signal indicative of a monitored current at 402, and, in response, at 404, providing an output comprising a signal having a magnitude indicative of the current being monitored. At 406, a differential signal indicative of the current being monitored can be scaled, such as using a divider circuit, and at 408, the scaled representation can be compared against a threshold signal indicative of a fault current threshold, using a comparator circuit. The technique, 400, of FIG. 4 can be implemented using one or more electronic circuit as shown and described in relation to other examples herein, such as discussed above in relation to FIG. 1, FIG. 2, or FIG. 3.

FIG. 5A, FIG. 5B, FIG. 5C, and FIG. 5D collectively illustrate simulations results corresponding to an illustrative example of a current monitoring circuit. Such a current monitoring circuit can include a structure similar to the example of FIG. 1, such as having a comparator circuit 306 topology as shown in FIG. 3 used as the comparator circuit 106 of FIG. 1. In the illustrative examples of FIGS. 5A through 5D, the simulation conditions are as follows. The common-mode input voltage (as shown illustratively in FIG. 5A) is a pulse-width modulated (PWM) signal having a period corresponding to a frequency of 200 kilohertz (KHz), and having an amplitude spanning from −20V to +80V. The duty cycle of the PWM signal is varied from 20 percent to 80 percent, and a power supply voltage for the difference amplifier and comparator circuits (e.g., VCC) is set to 5V. A differential-mode input signal (shown illustrative in FIG. 5B) ramps up from 0.98V to 1.02V, then ramps down to 0.92V. The comparator circuit threshold voltage is set to 1V with a hysteresis value of 60 mV.

Figure 5A:
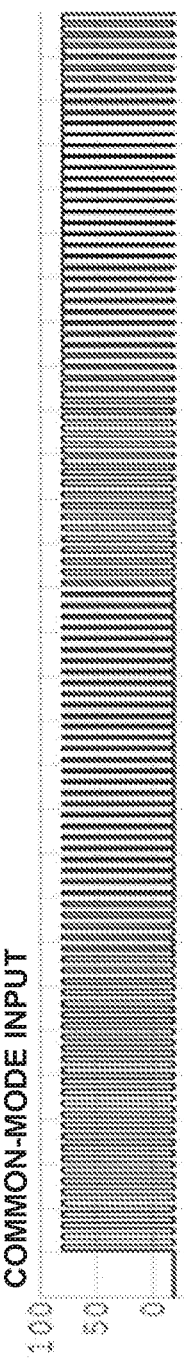
FIG. 5A, FIG. 5B, FIG. 5C, and FIG. 5D collectively illustrate simulations results corresponding to an illustrative example of a current monitoring circuit.
Figure 5B:
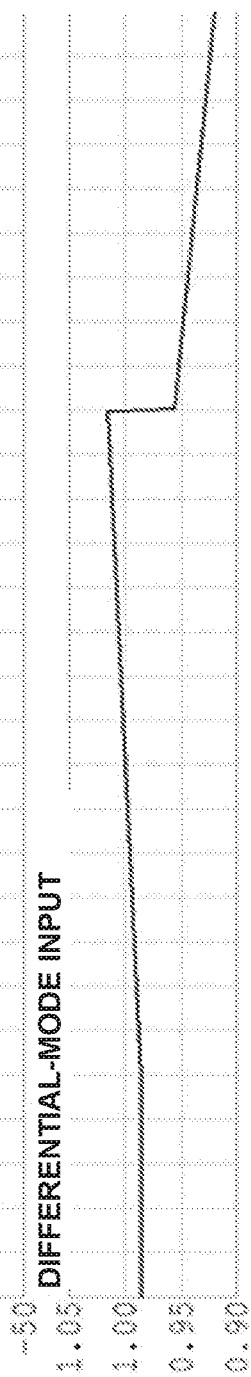
Figure 5C:
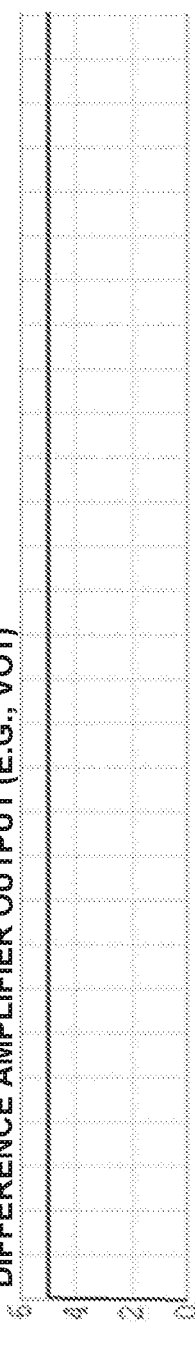
Figure 5D:
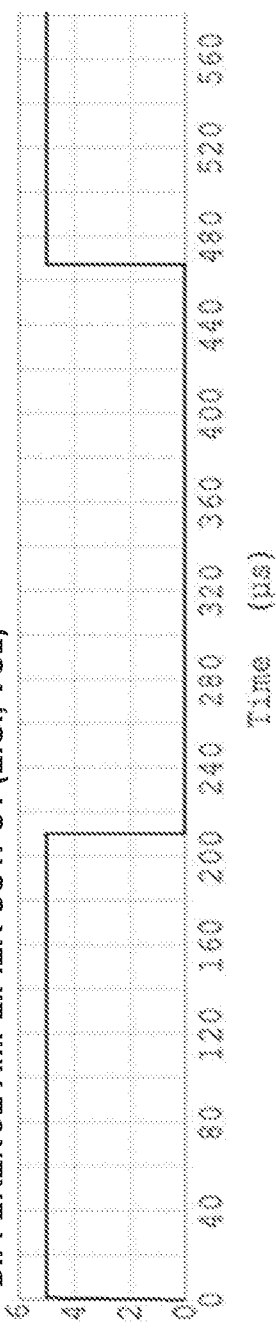

A gain of the difference amplifier is set to 20. Because the power supply voltage for the difference amplifier is 5V, and its gain is 20, the maximum acceptable differential input for the difference amplifier can be approximated as 5V/20 or 250 mV. As shown in FIG. 5C, because the differential input signal to the difference amplifier is near 1V, the current sense amplifier is saturated and its output is roughly constant at about 5V. FIG. 5D illustrates that the comparator circuit output stage changes polarity once when the differential-mode input voltage is above 1V (e.g., comparator output transitioning from 5V to 0V), and again after the differential input signal is below 0.94V (e.g., comparator output transition from 0V to 5V). Generally, FIG. 5D shows that the comparator circuit still functions properly in the presence of saturation of the difference amplifier, because it does not rely upon the difference amplifier.

Various Notes

Each of the non-limiting aspects in this document can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A current monitoring circuit arranged to provide enhanced dynamic range and rapid fault detection, the current monitoring circuit comprising:
   a difference amplifier circuit comprising a two-terminal input to receive a differential signal indicative of a current being monitored and an output to provide a signal having a magnitude indicative of the current being monitored;
   a voltage scaling circuit; and
   a comparator circuit comprising a two-terminal input to receive a scaled representation of the differential signal of the current being monitored, from the voltage scaling circuit, for comparison against a threshold signal indicative of a fault current threshold;
   wherein a latency of the comparator circuit is shorter in duration than a corresponding group delay of the difference amplifier circuit; and
   wherein the comparator circuit is arranged to receive the scaled representation from an input side of the difference amplifier, bypassing the difference amplifier.

2. The current monitoring circuit of claim 1, wherein the voltage scaling circuit comprises:
   a first voltage divider circuit coupled to a first input of the two-terminal input of the comparator circuit; and
   a second voltage divider circuit coupled to a second input of the two-terminal input of the comparator circuit.

3. The current monitoring circuit of claim 2, wherein the first voltage divider circuit comprises a first resistor divider circuit; and
   wherein the second voltage divider circuit comprises a second resistor divider circuit.

4. The current monitoring circuit of claim 1, wherein the comparator circuit, through the voltage scaling circuit, comprises an output indicative of the comparison of the scaled representation of the differential signal of the current being monitored, from the voltage scaling circuit, against the threshold, the output operative in a condition wherein the difference amplifier is saturated.

5. The current monitoring circuit of claim 1, wherein the comparator circuit comprises a continuous-time circuit topology; and
   wherein the current monitoring circuit comprises a current source coupled to an input of the comparator circuit to provide the threshold signal.

6. The current monitoring circuit of claim 1, wherein the comparator circuit includes a switched-capacitor input circuit, the switched-capacitor input circuit including inputs to receive the scaled representation of the differential signal, and the threshold signal.

7. The current monitoring circuit of claim 6, wherein the comparator circuit comprises a fully-differential pre-amplifier block.

8. The current monitoring circuit of claim 1, further comprising a current sensing resistor configured to provide the differential signal representative of a voltage developed across the current sensing resistor indicative of the current being monitored.

9. A method for current monitoring using a current monitoring circuit providing enhanced dynamic range and rapid fault, the method comprising:
   receiving a differential signal indicative of a current being monitored;
   in response, providing an output comprising a signal having a magnitude indicative of the current being monitored using an amplifier circuit;
   scaling the differential signal indicative of the current being monitored to provide a scaled representation; and
   comparing the scaled representation against a threshold signal indicative of a fault current threshold, using a comparator circuit, in a condition where the amplifier circuit is saturated;
   wherein the comparator circuit is arranged to receive the scaled representation from an input side of the difference amplifier, bypassing the amplifier circuit.

10. The method of claim 9, wherein scaling the differential signal includes using a first voltage divider circuit coupled to a first input of a two-terminal input of the comparator circuit to scale a first polarity of the differential signal; and
    using a second voltage divider circuit coupled to a second input of a two-terminal input of the comparator circuit to scale a second polarity of the differential signal.

11. The method of claim 9, wherein a latency of the comparator circuit is shorter in duration than a corresponding group delay of the amplifier circuit.

12. The method of claim 9, wherein the threshold signal is provided as an input to the comparator circuit.

13. The method of claim 12, wherein the threshold signal comprises a specified current proportional to a specified threshold voltage.

14. The method of claim 12, wherein the comparator circuit comprises a comparator block having an inverting input and a non-inverting input; and
    wherein the comparator circuit includes a switched-capacitor input circuit; and
    wherein the method comprises aggregating the threshold signal with the first and second polarities of the differential signal comprising the scaled representation of the current being monitored, using the switched-capacitor input circuit, and providing an aggregated representation of the differential signal and the threshold signal to the inverting and non-inverting inputs of the comparator block.

15. The method of claim 14, comprising providing hysteresis in comparing the scaled representation by injecting a specified hysteresis offset into at least one of the inverting input or the non-inverting, input.

16. A current monitoring circuit arranged to provide enhanced dynamic range and rapid fault detection, the current monitoring circuit comprising:
    an amplification means for receiving a differential signal indicative of a current being monitored and in response, providing an output comprising a signal having a magnitude indicative of the current being monitored;
    a voltage scaling means for scaling the differential signal representative of the current being monitored to provide a scaled representation; and
    a means for comparing the scaled representation against a threshold signal indicative of a fault current threshold;
    wherein a latency of the means for comparing the scaled representation against the threshold circuit is shorter in duration than a corresponding group delay of the amplification means;
    wherein the means for comparing the scaled representation is arranged to receive the scaled representation from an input side of the amplification means, bypassing the amplification means.

17. The current monitoring circuit of claim 16, wherein the voltage scaling means comprises:
    a first divider means coupled to a first input of the means for comparing the scaled representation; and
    a second divider means coupled to a second input of the means for comparing the scaled representation.

18. The current monitoring circuit of claim 16, wherein the means for comparing the scaled representation against the threshold signal continues to be operable when the amplification means is saturated.

19. The current monitoring circuit of claim 16, wherein the threshold signal is adjustable.

20. The current monitoring circuit of claim 19, comprising a threshold signal generation means to provide the threshold signal.

* * * * *